United States Patent [19]

Heo

[11] Patent Number: 5,908,317

[45] Date of Patent: Jun. 1, 1999

[54] METHOD OF FORMING CHIP BUMPS OF BUMP CHIP SCALE SEMICONDUCTOR PACKAGE

[75] Inventor: Young Wook Heo, Kyungki-do, Rep. of Korea

[73] Assignees: Anam Semiconductor Inc., Seoul, Rep. of Korea; Amkor Technology, Inc., Chandler, Ariz.

[21] Appl. No.: 08/813,725

[22] Filed: Mar. 7, 1997

[30] Foreign Application Priority Data

Mar. 11, 1996 [KR] Rep. of Korea .......................... 96-6302
Mar. 11, 1996 [KR] Rep. of Korea .......................... 96-6303

[51] Int. Cl.⁶ .......................... H01L 21/283; H01L 21/56; H01L 21/58; H01L 21/603
[52] U.S. Cl. ...................... 438/617; 438/614; 228/180.22
[58] Field of Search .................................... 438/613, 617, 438/FOR 343, 614, 616; 228/180.22; 257/737, 738

[56] References Cited

U.S. PATENT DOCUMENTS

| | | |
|---|---|---|
| 4,067,104 | 1/1978 | Tracy . |
| 4,661,192 | 4/1987 | McShane . |
| 4,752,027 | 6/1988 | Gschwend . |
| 4,875,618 | 10/1989 | Haseqawa et al. . |
| 5,060,843 | 10/1991 | Yasuzato et al. . |
| 5,071,787 | 12/1991 | Mori et al. . |
| 5,090,119 | 2/1992 | Tsuda et al. . |
| 5,186,381 | 2/1993 | Kim . |
| 5,485,949 | 1/1996 | Tomura et al. . |
| 5,492,863 | 2/1996 | Higgins, III . |
| 5,496,775 | 3/1996 | Brooks . |
| 5,508,561 | 4/1996 | Tago et al. . |
| 5,550,083 | 8/1996 | Koide et al. . |
| 5,569,963 | 10/1996 | Rostoker et al. . |
| 5,579,573 | 12/1996 | Baker et al. . |
| 5,641,113 | 6/1997 | Somaki et al. . |
| 5,650,667 | 7/1997 | Liou . |

FOREIGN PATENT DOCUMENTS

| 350736 | 3/1991 | Japan . |
|---|---|---|
| 3187228 | 8/1991 | Japan . |

*Primary Examiner*—David Graybill
*Attorney, Agent, or Firm*—Skjerven, Morrill, MacPherson, Franklin & Friel LLP; Thomas S. MacDonald

[57] ABSTRACT

A method of forming chip bumps of a bump chip scale semiconductor package, such a package and a chip bump are disclosed. In the bump chip scale semiconductor package produced by the above method, the chip bumps are directly formed on the chip pads of a semiconductor chip. The above chip bumps are used as the signal input and output terminals of the package and are used as surface mounting joints when the chip is mounted to a mother board.

20 Claims, 7 Drawing Sheets

METHOD OF FORMING CHIP BUMPS OF BUMP CHIP SCALE SEMICONDUCTOR PACKAGE

BACKGROUND OF THE INVENTION

1. Field of the Invention

The present invention relates, in general, to a method of forming the chip bumps of a bump chip scale semiconductor package, and to such a package and chip bump and, more particularly, to an improvement in such a method, package and chip bumps for directly mounting a semiconductor chip to a mother board by forming the chip bumps on the chip pads of the semiconductor chip.

2. Description of the Prior Art

The recent trend of compactness, smallness, lightness, thinness and multi-function of semiconductor-electronic appliances is promoted by high integration and high effectiveness of semiconductor chips. In order to meet such a recent trend, it is necessary to achieve compactness, smallness, lightness and thinness of semiconductor packages and to maximize the number of fins of each package. That is, it is necessary to reduce the size of the packages while improving the operational function of the packages. In this regard, the packages using solder balls as the signal input and output terminals are preferred to the packages using leads as the signal input and output terminals.

A BGA (ball grid array) semiconductor package, which is a typical package using the solder balls as its signal input and output terminals, remarkably reduces the package size and remarkably improves integration degree of the package in comparison with a typical QFP (quad flat package). However, the typical BGA package is problematic in that it fails to effectively reduce the package size due to the molding zone thus regrettably requiring a large surface mounting area when it is mounted to a mother board. Therefore, such a BGA package fails to achieve compactness, smallness, lightness and thinness of semiconductor-electronic appliances.

FIG. 9 is a sectional view showing the construction of a typical BGA package. As shown in the drawing, the BGA package comprises a semiconductor chip 1 which is attached to the top center of a PCB (printed circuit board) 7 by epoxy resin. The PCB 7 has a circuit pattern 71 on its edge portion. The chip pads of the semiconductor chip 1 are electrically connected to the circuit pattern 71 of the PCB 7 through a plurality of wires 8. A predetermined molding zone including the chip 1 and wires 8 is packaged by a molding compound 9 thus protecting the chip 1 and wires 8 from atmosphere. A plurality of solder balls 2 are formed on the bottom side of the PCB 7 and are used as signal input and output terminals of the package.

As described above, the typical BGA package uses the wires 8, so that the area of the package is enlarged due to the wire loop thus reducing the package density while surface-mounting the packages. In addition, it is difficult to design the circuit pattern on the mother board due to the enlarged area of the package. Another problem of the above BGA package resides in that interfacial separation may be generated in the junction between the parts of the package due to a change of temperature.

SUMMARY OF THE INVENTION

In order to overcome the above problems, the present invention provides an improved method of forming chip bumps of a bump chip scale semiconductor package. In the method, a plurality of bumps, having tails, are formed on the chip pads of a semiconductor chip using conventional solder wires and/or gold wires. Thereafter, a plurality of chip bumps are easily and effectively formed using the tails of the bumps. The bump chip scale semiconductor package produced by the above chip bump forming method has a size almost equal to the size of the semiconductor chip thus effectively achieving compactness, smallness, lightness and thinness of semiconductor packages.

It is, thus, an object of the present invention to provide a method of forming chip bumps of a bump chip scale semiconductor package which forms a plurality of bumps, having tails, on the chip pads of a semiconductor chip using conventional solder wires and/or gold wires and easily and effectively forms a plurality of chip bumps using the tails of the bumps.

Another object of the present invention is to provide a compact, small, lightened and thinned bump chip scale semiconductor package produced by the above chip bump forming method.

A further object of the present invention is to provide a chip bump which is formed by the above chip bump forming method and is used as a signal input or output terminals of a bump chip scale semiconductor package.

In the primary embodiment of this invention, the method for forming chip bumps of a bump chip scale semiconductor package, comprising the steps of: a) forming a gold bump on each chip pad of a semiconductor chip using a gold wire from a ball bond wire bonder, the gold bump having a gold tail; b) applying a resin layer to the gold bump side of the semiconductor chip and curing the resin layer thus forming a resin coating layer on the gold bump side of the semiconductor chip; c) bending the gold tail of the gold bump using a coining machine thus forming a bent gold tail; d) applying a flux to the bent gold tail side of the chip and positioning a solder ball, having a desirable size, on the bent gold tail; and e) heating the solder ball using heat treating means thus forming a chip bump, the chip bump having a spherical or hemispherical configuration and including the bent gold tail as its core.

In the second embodiment of this invention, the method for forming chip bumps of a bump chip scale semiconductor package, comprising the steps of: a) forming a solder bump on each chip pad of a semiconductor chip using a solder wire from a ball bond wire bonder, the solder bump having a solder tail; b) applying a resin layer to the solder bump side of the semiconductor chip and curing the resin layer thus forming a resin coating layer on the solder bump side of the semiconductor chip; and c) fusing the solder tail using heat treating means and cooling the fused solder tail thus forming the fused solder tail into a spherical or hemispherical chip bump due to gravity and surface tension.

In the third embodiment of this invention, the step "a" of forming the solder bump in the above method according to the second embodiment comprises the steps of: forming a gold bump core on each chip pad of the semiconductor chip using a gold wire; and forming the solder bump, having the solder tail, on the gold bump core using the solder wire.

In another embodiment, the present invention also provides a bump chip scale semiconductor package, comprising: a semiconductor chip having a plurality of chip pads as conductive electrodes and a passivation thin film formed on one side of the chip at a position except for the chip pads; a plurality of chip bumps used as signal input and output terminals of the package relative to a mother board and used as joints for mounting the semiconductor chip to the mother board, each of the chip bumps comprising a gold bump core, welded to each of the chip pads, and a solder bump covering the gold bump core; and a resin coating layer layered on the passivation thin film and surrounding a lower portion of each of the chip bumps.

In a further embodiment, the present invention provides a chip bump used as a signal input or output terminal of a chip scale semiconductor package relative to a mother board and used as a joint for mounting the chip to the mother board, comprising: a hemispherical gold bump; an arcuate gold tail integrally extending from the top of the gold bump; and a spherical or hemispherical solder bump formed on the gold bump thus forming the chip bump with the arcuate gold tail being used as a core.

In still another embodiment, the present invention provides a chip bump used as a signal input or output terminal of a chip scale semiconductor package relative to a mother board and used as a joint for mounting the chip to the mother board, comprising: a hemispherical gold bump; and a spherical or hemispherical solder bump formed on the gold bump in order to cover the gold bump thus forming the chip bump with the gold bump being used as a core.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

FIGS. 1A to 1E are views showing the continued steps of forming a plurality of chip bumps of a bump chip scale semiconductor package in accordance with the primary embodiment of the present invention. In the following description, the solder or gold wires used in this invention may be selected from solder or gold wires which have been typically used in the wire bonding step of a conventional package producing process.

Figure 1A:
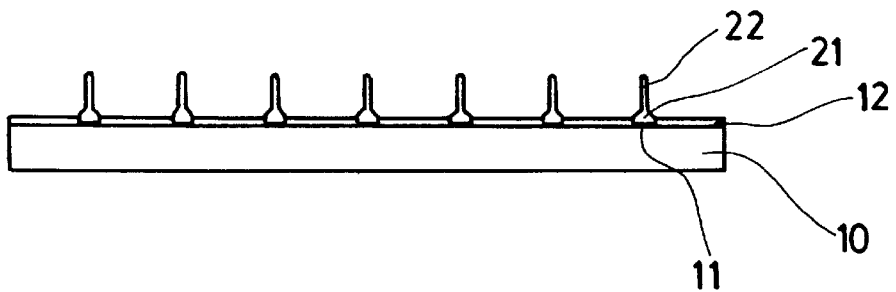
FIGS. 1A to 1E are views showing the continued steps of forming a plurality of chip bumps of a bump chip scale semiconductor package in accordance with the primary embodiment of the present invention.

FIG. 1A is a side sectional view showing the step of forming a plurality of gold bumps 21, each of which has a straight gold tail 22 on one end thereof, on the chip pads 11, which are formed on one side of a semiconductor chip 10, using a plurality of gold wires. In this step, each of the straight gold tails 22, which is to be formed into a core of a solder bump, has a height of 5–40 mil (1 mil=$\frac{1}{1000}$ inch), preferably 10–30 mil. A passivation thin film 12, which is not chemically reactive but is electrically insulated, is formed on the semiconductor chip 10 at a position except for the chip pads 11. Such a passivation thin film 12 may be formed from glass or polyimide.

Figure 1B:
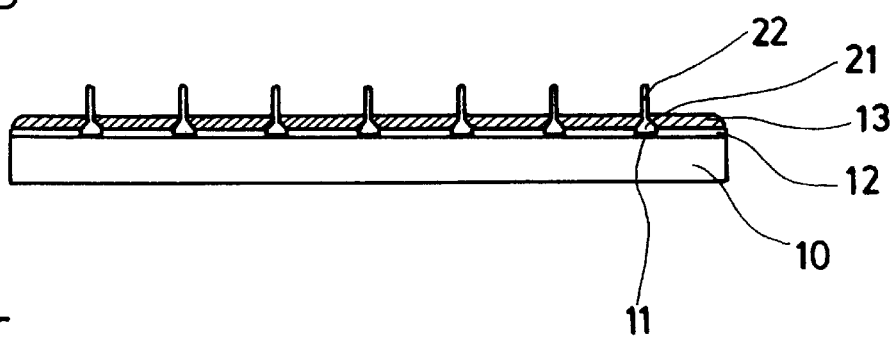

FIG. 1B is a side sectional view showing the step of forming a resin coating layer 13 by applying a resin layer of a uniform thickness onto the passivation thin film 12 of the chip 10 around the solder bump leaving a part of each solder tail extending from the resin layer as clearly seen in FIG. 1B, and by heating and curing the resin layer at a high temperature of about 150–240° C. for at least 30 minutes. In this step, the resin may be selected form a high insulating resin such as polyimide or epoxy resin.

Figure 1C:
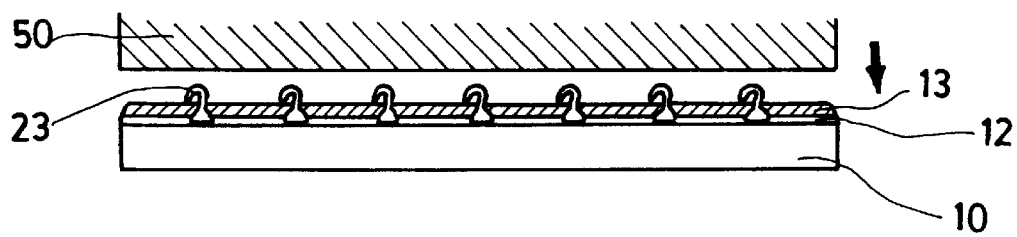

FIG. 1C is a side sectional view showing the step of forming bent gold tails 23 by bending the exposed parts of the straight gold tails 22 using a coining machine 50 after curing the resin coating layer 13. In this step, the exposed parts of the gold tails 22 are exposed outside the cured layer 13.

Figure 1D:
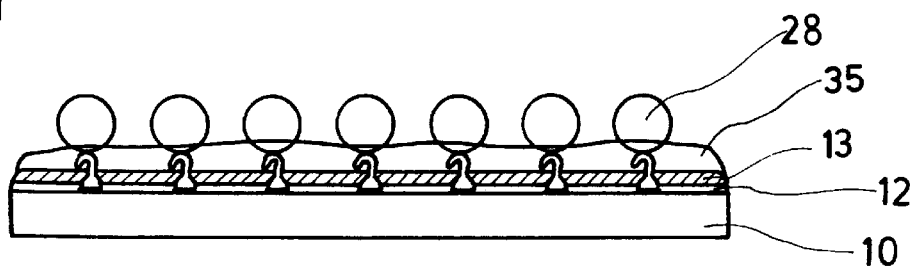

Fig. 1D is a side sectional view showing the step of positioning a plurality of Sn/Pb base solder balls 28 on the bent gold tails 23. In this step, a flux 35 is applied to the bent gold tails 23 prior to positioning the solder balls 28, which have been previously formed into a desirable size, on the bent gold tails 23. The flux 35 may be selected from a resin, organic or inorganic base flux. However, it is preferable to use a rosin base flux, which is a kind of resin base flux, as the flux 35.

Figure 1E:
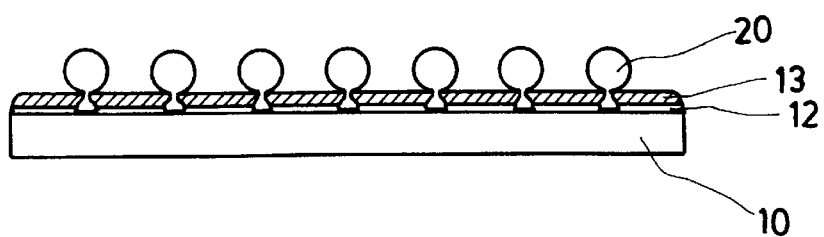

FIG. 1E is a side sectional view showing the step of reforming a plurality of chip bumps 20. In this step, the semiconductor chip 10 from the solder ball positioning step is treated by a convection oven, furnace or IR (infrared ray) reflow device maintaining a high temperature higher than 190° C. thus reforming the chip bumps 20 each of which has a spherical or hemispherical configuration with a core being formed from each bent gold tail 23.

Figure 2A:
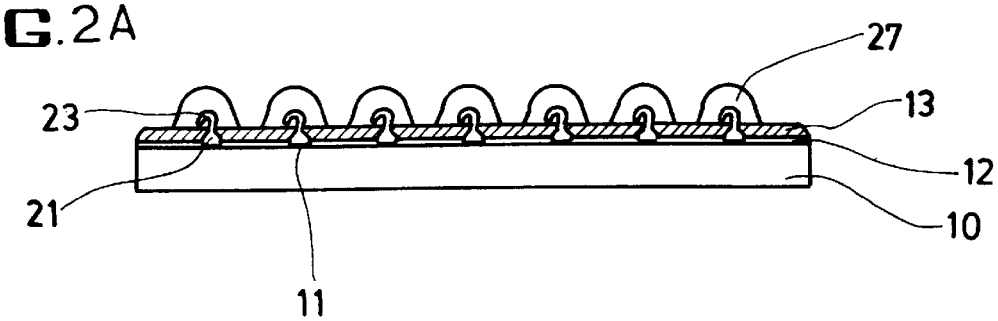
FIGS. 2A and 2B are views showing the steps of positioning solder balls, being substituted for the step of FIG. 1D, in accordance with second and third embodiments, respectively.
Figure 2B:
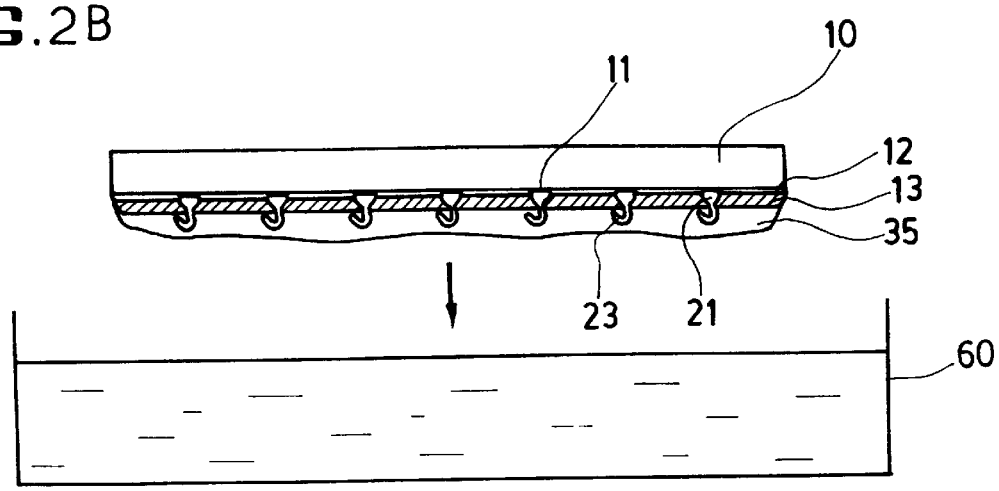

FIGS. 2A and 2B are views showing the steps of positioning the solder balls, substituting for the step of FIG. 1D, in accordance with second and third embodiments, respectively.

FIG. 2A is a side view showing the step of applying a solder paste 27 on the resin coating layer 13 of the chip 10 at a position including each bent gold tail 23. In this step, a sufficient amount of solder paste 27 enough to form a desirable-sized chip bump is applied to the resin coating layer 13 at a position including each bent gold tail 23 through a stencil or screen printing process. In this step, a flux may be used. In the method of forming chip bumps according to the second embodiment, the other steps except for the solder ball positioning step remain the same as described for the primary embodiment.

FIG. 2B is a side view showing the step of forming a solder bump on each bent gold tail 23. In this step, a flux, preferably a rosin base flux 35 is applied to the resin coating layer 13 thus covering the bent gold tails 23. The chip 10 in turn is turned over with the bent gold tails 23 being directed downward. Thereafter, the bent gold tails 23 are immersed into a solder pot 60 thus forming the solder bumps on the respective bent gold tails 23. In the method of forming chip bumps according to the third embodiment, the other steps except for the solder ball positioning step remain the same as described for the primary embodiment.

In addition, it should be understood that the solder bumps of this invention may be formed on the bent gold tails 23 by a wave soldering process in place of immersing the bent gold tails 23 into the solder pot 60.

Figure 6:
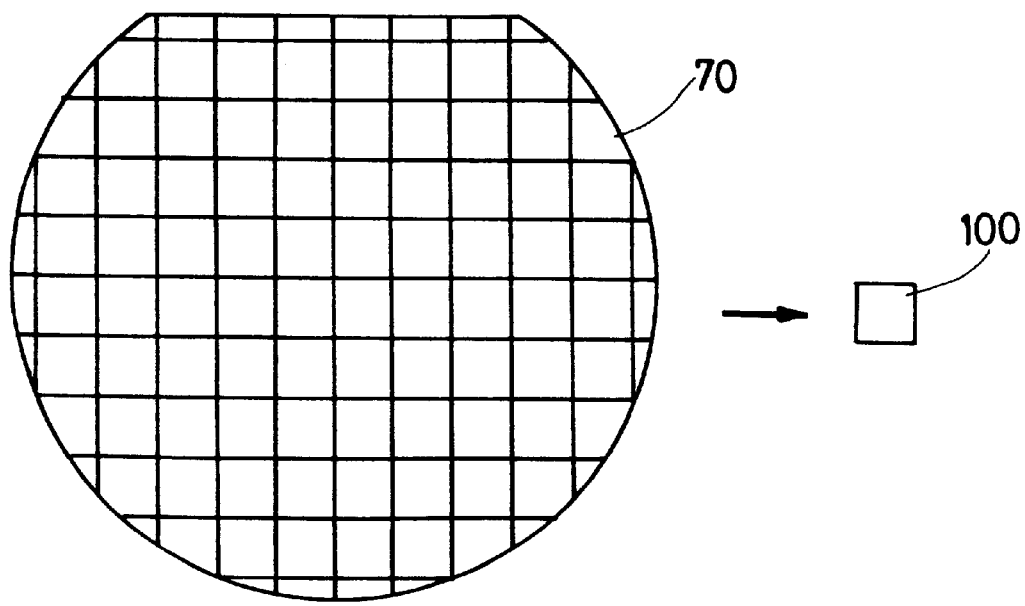
FIG. 6 is a view showing a method of forming a plurality of bumps on the unit semiconductor chips of a wafer at the same time prior to cutting the wafer into the unit semiconductor chips in accordance with the present invention.
Figure 7A:
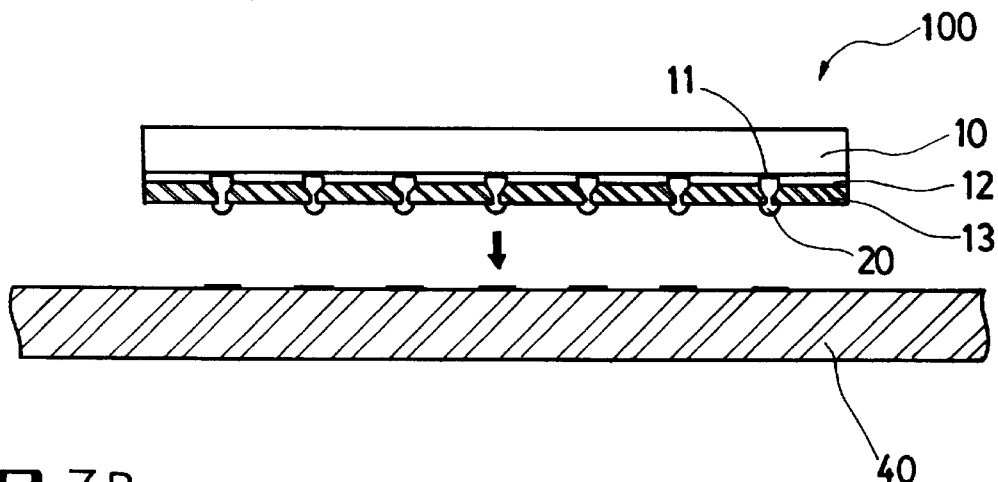
FIGS. 7A and 7B are views showing the continued steps of mounting the bump chip scale semiconductor package of this invention to a mother board.

In accordance with the present invention, the chip bumps 20 may be directly formed on a wafer 70 as shown in FIG. 6 in place of forming the chip bumps 30 on a unit semiconductor chip. After forming the chip bumps 20 on the wafer 70, the wafer 70 is cut into a plurality of unit semiconductor chips using a sawing machine prior to producing a unit bump chip scale semiconductor package 100 as shown in FIG. 7A. In this case, it is possible to remarkably improve work efficiency while producing the bump chip scale semiconductor packages.

In the method of forming the chip bumps 20 of a bump chip scale semiconductor package according to each of the primary to third embodiments of this invention, the bent gold tails 23 are formed from gold wires which are cheap and have a high conductivity in comparison with expensive solder wires. Thereafter, the chip bumps 20 are simply and effectively formed using the bent gold tails 23 as the cores of the chip bumps 20. In a bump chip scale semiconductor package with such chip bumps 20 being formed on the chip pads 11, the chip bumps 20 are used as the signal input and output terminals of the package and are used as surface mounting joints when the chip 10 is mounted on the mother board. Therefore, the method of this invention provides a compact, small, lightened and thinned bump chip scale semiconductor package.

FIGS. 3A to 3F are views showing the continued steps of forming the chip bumps of a bump chip scale semiconductor package in accordance with the fourth embodiment of the this invention. In the fourth embodiment, the solder tails 26 of a plurality of solder bumps 25 are directly fused by a heat treating means prior to cooling the fused solder bumps 25, thus forming the chip bumps 20 different from the primary to third embodiments in which the bent gold tails 23 are used as the cores of the chip bumps 20.

Figure 3A:
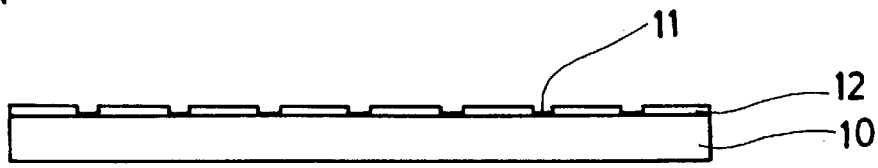
FIGS. 3A to 3F are views showing the continued steps of forming a plurality of chip bumps of a bump chip scale semiconductor package in accordance with the fourth embodiment of the present invention.

FIG. 3A is a side sectional view showing a semiconductor chip 10 having a passivation thin film 12 which is formed on the chip 10 except for the chip pads 11. The detailed description of the step of FIG. 3A may be referred to the description of the step of FIG. 1A.

Figure 3B:
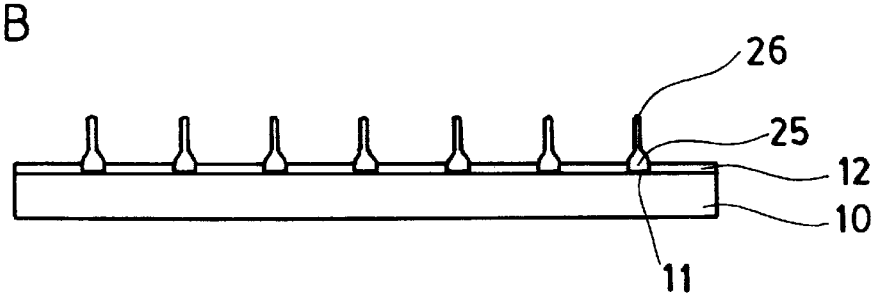

FIG. 3B is a side sectional view showing the step of forming a plurality of solder bumps 25. In this step, each of the bumps 25 has a straight solder tail 26 on one end thereof and is formed on each chip pad 11 of the chip 10 using a solder wire from a ball bonding wire bonder. In this step, each of the straight solder tails 26, which is to be formed into a chip bump having an appropriate diameter, has a height of 5–40 mil, preferably 10–30 mil.

Figure 3C:
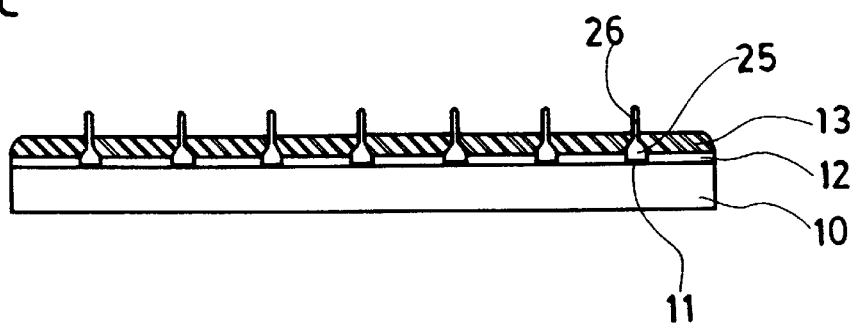

FIG. 3C is a side sectional view showing the step of forming a resin coating layer 13 by applying a resin layer of a uniform thickness onto the passivation thin film 12 of the chip 10 having the solder bumps 25 and by heating and curing the resin layer at a high temperature of about 150–240° C. for at least 30 minutes. The detailed description of the step of FIG. 3C may be referred to the description of the step of FIG. 1B.

Figure 3D:
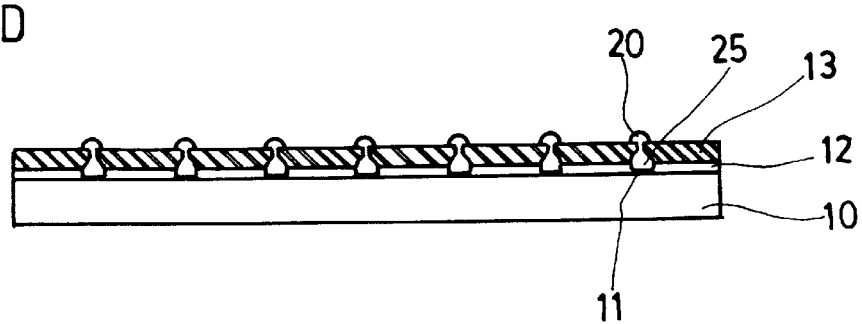

FIG. 3D is a side sectional view showing the step of forming the chip bumps 20. In this step, the solder tails 26 are fused using a heat treating means prior to cooling the fused tails 26. While cooling the fused tails 26, the fused tails 26 are formed into spherical or hemispherical chip bumps 20 due to gravity and surface tension. The heat treating means and temperature conditions used in this step may be referred to those of the step of the primary to third embodiments of this invention.

In the above step, a flux 35, preferably a rosin base flux may be applied to the resin coating layer 13 prior to forming the chip bumps 20.

Figure 3E:
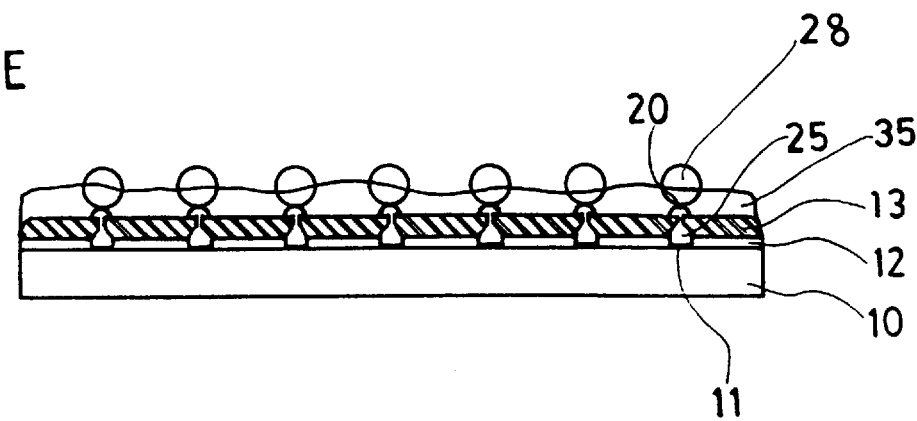
Figure 3F:
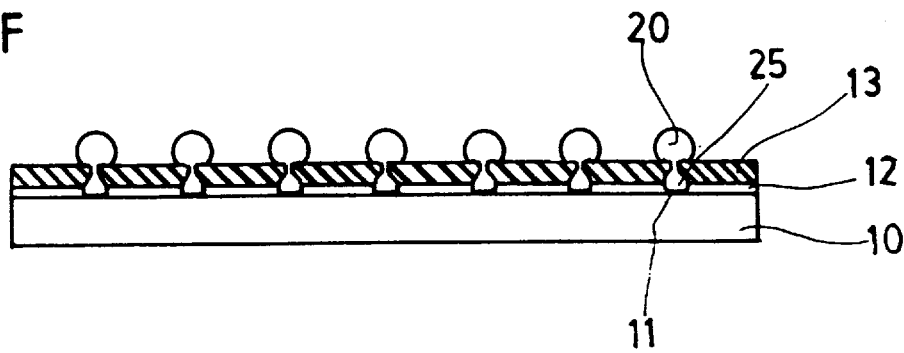

FIGS. 3E and 3F show a method of enlarging the diameter of each chip bump 20 as desired. As shown in FIGS. 3E and 3F, when the diameter of each chip bump 20 formed from a solder wire is not sufficient, a rosin base flux 35 is applied to the resin coating layer 13. Thereafter, a solder paste applying step or a solder ball positioning step is performed. In the solder paste applying step, a sufficient amount of solder paste 27 enough to form a desirable-sized chip bump is applied to each existing chip bump 20. Meanwhile, in the solder ball positioning step, a previously-formed solder ball 28 having a diameter enough to form a desirable-sized chip bump is positioned on each existing chip bump 20. After the solder paste applying step or the solder ball positioning step, the chip 10 is treated by a heat treating means such as an oven or furnace thus reforming the chip bumps 20 and enlarging the diameters of the chip bumps 20.

Figure 4:
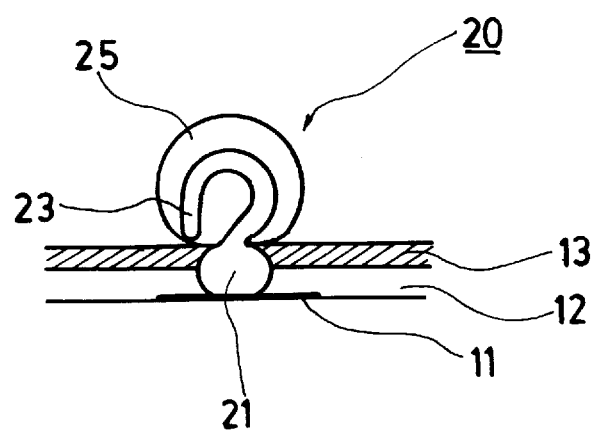
FIG. 4 is a sectional view of a chip bump formed in accordance with each of the chip bump forming methods of the primary to third embodiments of this invention.

FIG. 4 is a sectional view of a chip bump 20 which is formed in accordance with each of the chip bump forming methods of the primary to third embodiments of this invention. As shown in FIG. 4, the chip bump 20, which is used as a signal input or output terminal of the package and is used as a surface mounting joint when the chip 10 is mounted to a mother board, comprises a hemispherical gold bump 21, an arcuate gold tail 23 integrally extending from the top of the gold bump 21 and a spherical or hemispherical solder bump 25 formed on the gold bump 21 with the arcuate gold tail 23 being used as the core of the solder bump 25. In this case, the gold tail 23 has a length of 5–40 mil, preferably 10–30 mil.

Figure 5A:
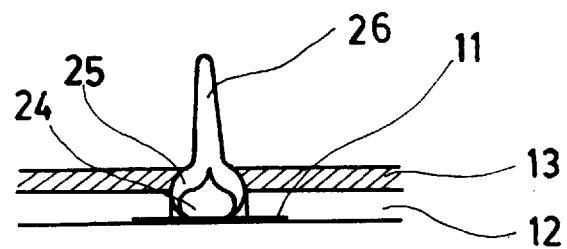
FIG. 5A to 5C are sectional views showing a method of forming a chip bump in accordance with another example of the fourth embodiment of this invention.
Figure 5B:
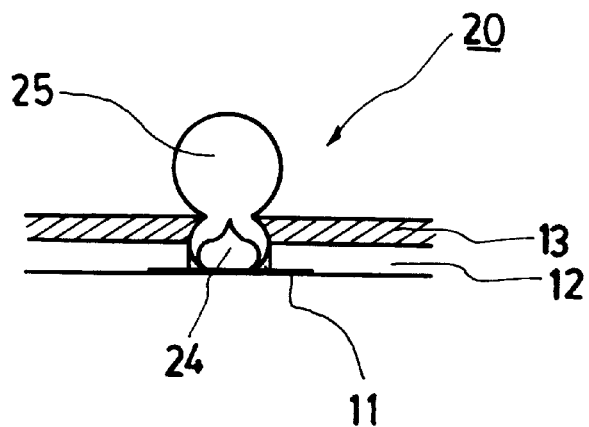
Figure 5C:
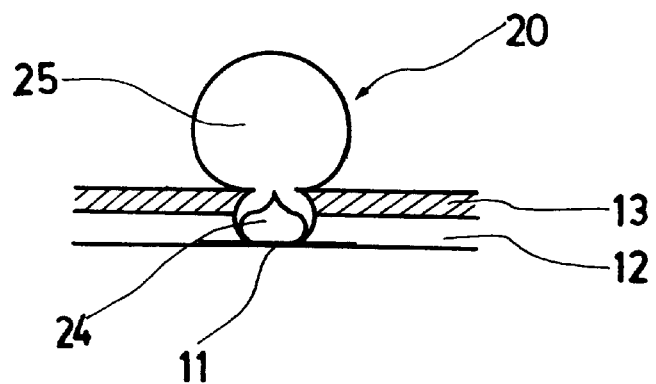

FIG. 5A to 5C are sectional views showing a method of forming a chip bump in accordance with another example of the fourth embodiment of this invention. As shown in the drawings, the chip bumps 20 of this invention may be formed by the following steps in place of directly forming the chip bumps 20 on the chip pads 11. That is, a gold bump 24 free from a gold tail is formed on each chip pad 11 of a semiconductor chip 10 using a gold wire. After the gold bump forming step, a solder bump 25 having a solder tail 26 is formed on the core of the gold bump 24 using a solder wire as shown in FIG. 5A. Thereafter, the same chip bump forming step as that of the fourth embodiment of this invention is performed thus forming the chip bump 20 as shown in FIG. 5B. In this case, the same step of enlarging the chip bump diameter as that of the fourth embodiment is performed thus reforming the chip bump 20 and enlarging the diameter of the chip bump 20. In this embodiment, the chip bump 20 comprises a hemispherical gold bump core 24 and a spherical or hemispherical solder bump 25 formed on the top of the gold bump core 24 while surrounding the gold bump core 24 as shown in FIG. 5C.

As shown in FIG. 6, the chip bumps 20 of this invention may be directly formed a plurality of semiconductor chips of a wafer 70 at the same time. After forming the chip bumps 20 on the wafer 70, the wafer 70 is cut into a plurality of unit semiconductor chips using a sawing machine prior to producing a unit bump chip scale semiconductor package 100. In this case, it is possible to remarkably improve work efficiency while producing the bump chip scale semiconductor packages.

Figure 7B:
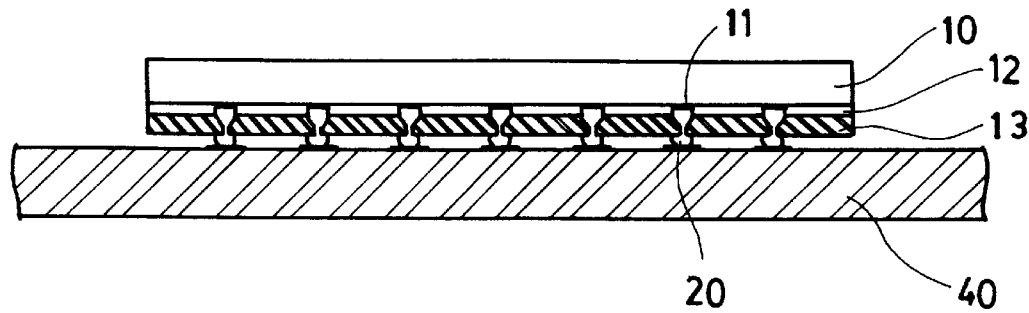

FIGS. 7A and 7B are views showing the continued steps of turning over a bump chip scale semiconductor package 100 of this invention and of mounting the package 100 to a mother board 40.

The bump chip scale semiconductor package 100 produced in accordance with the present invention comprises a semiconductor chip 10. The chip 10 has a plurality of chip pads 11, used as conductive electrodes, and a passivation thin film 12 formed on one side of the chip 10 at a position except for the chip pads 11. The package 100 also includes a plurality of chip bumps 20, which are used as signal input and output terminals of the package relative to a mother board and are used as joints for mounting the semiconductor chip 10 to the mother board. Each chip bump 20 comprises a gold bump core, which is welded to each chip pad 11, and a solder bump which covers the gold bump core. A resin coating layer 13 is layered on the passivation thin film 12 and surrounds the lower portions of the chip bumps 20. Each gold bump core may be a core with an arcuate gold tail. In this case, the gold tail has a length of 5–40 mil, preferably 10–30 mil. Alternatively, each gold bump core may be a tailless core.

Figure 8:
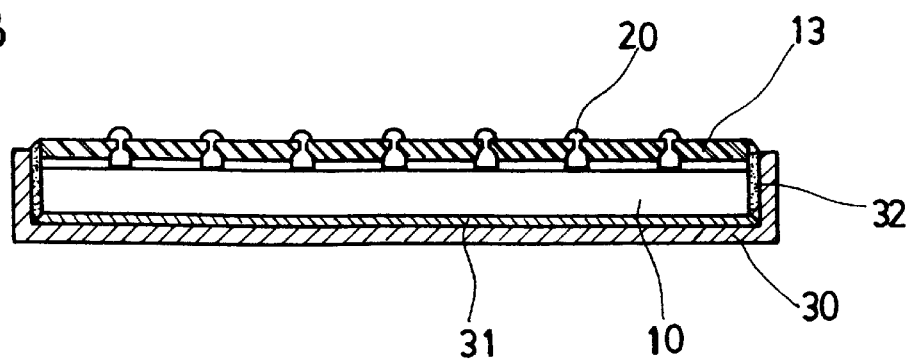
FIG. 8 is a sectional view showing the construction of a bump chip scale semiconductor package covered with a lid in accordance with a further embodiment of the present invention.
Figure 9:
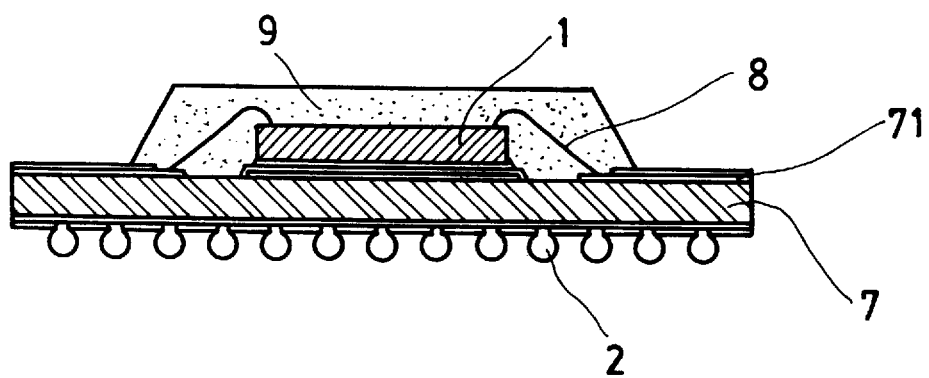
FIG. 9 is a sectional view showing the construction of a typical BGA (ball grid array) semiconductor package.

FIG. 8 is a sectional view showing the construction of a bump chip scale semiconductor package 100 covered with a lid 30 in accordance with a further embodiment of the present invention.

In the embodiment of FIG. 8, the lid 30 covers the five surfaces of the hexahedral semiconductor chip 10 except for the surface having the chip bumps 20 thus protecting the chip 10 from atmospheric environment. The above lid 30 is formed from a high thermal conductive metal or plastic such as epoxy. The thermal conductive metal of the lid 30 may be selected from a group of copper, copper alloys, steels and stainless steels. In addition, a metal lid 30 may be preferably plated with nickel.

In order to attach the lid 30 to the chip 10, the lid 30 is primarily attached to the chip 10 with an epoxy base resin 31 being applied to the internal surface of the lid 30. Thereafter, the lid 30 and chip 10 are heated at a high temperature higher than 100° C. thus completely curing the resin 31. The junction between the chip 10 and the metal or plastic lid 30 is tightly filled with epoxy base resin without remaining any void in the junction.

As described above, the present invention provides a method of forming chip bumps of a bump chip scale semiconductor package. The method easily and effectively forms the chip bumps of the package at low cost. In the bump chip scale semiconductor package produced by the above method, the chip bumps are directly formed on the chip pads of a semiconductor chip. The above chip bumps are used as the signal input and output terminals of the package and are used as surface mounting joints when the chip is mounted to a mother board. Therefore, the method of this invention provides a compact, small, lightened and thinned bump chip scale semiconductor package.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming chip bumps of a bump chip scale semiconductor package, comprising:
    a) forming a gold bump on each chip pad of a semiconductor chip using a gold wire from a ball bond wire bonder, said gold bump having a gold tail;
    b) then applying a resin layer to the gold bump side of said semiconductor chip and around the gold bump leaving a part of each gold tail extending from the resin layer and curing the resin layer thus forming a resin coating layer on the gold bump side of the semiconductor chip;
    c) then bending the extending gold tail of said gold bump using a coining machine thus forming a bent gold tail;
    d) applying a flux to the bent gold tail side of said chip and positioning a solder ball on said bent gold tail; and
    e) heating the solder ball to form a chip bump, said chip bump having a spherical or hemispherical configuration and including said bent gold tail as its core.

2. The method according to claim 1, wherein positioning the solder ball:
    applying a solder paste to the resin coating layer at a position including said bent gold tail.

3. The method according to claim 1, wherein heating the solder ball comprises:
    turning over the chip with the bent gold tail being directed downward and immersing said bent gold tail into a solder pot thus forming a solder bump on said bent gold tail.

4. The method according to claim 1, wherein heating the solder ball comprises:
    turning over the chip with the bent gold tail being directed downward and forming a solder bump on said bent gold tail though a wave soldering process.

5. The method according to claim 1 wherein said gold tail of the gold bump has a height of 10–30 mil.

6. The method according to claim 1, wherein said resin layer of the resin coating layer is formed of polyimide or epoxy resin and is heated at a temperature of 150–240° C. for at least 30 minutes thus being cured.

7. The method according to claim 1, wherein said flux is a rosin base flux.

8. The method according to claim 1, wherein said heating is performed in a convection oven, furnace or IR (infrared ray) reflow device maintaining a temperature higher than 190° C.

9. A method for forming chip bumps of a bump chip scale semiconductor package, comprising:
    a) forming a solder bump including a solder tail on each chip pad of a semiconductor chip using a solder wire;
    b) then applying a resin layer to the solder bump side of said semiconductor chip and around the bump leaving a part of each solder tail extending from the resin layer and curing the resin layer thus forming a resin coating layer on a side of said solder bump; and
    c) then fusing the extending part of said solder tail and cooling the fused solder tail thus forming the fused solder tail into a spherical or hemispherical chip bump due to gravity and surface tension.

10. The method according to claim 9, wherein the forming of the solder bump comprises:
    forming a gold bump core on each chip pad of the semiconductor chip using a gold wire; and
    covering said gold bump core with the solder wire.

11. The method according to claim 9, wherein the curing of the resin coating layer is followed by applying a flux to the resin coating layer.

12. The method according to claim 11, wherein said flux is a rosin base flux.

13. The method according to claim 9, wherein said solder tail of the solder bump has a height of 10–30 mil.

14. The method according to claim 9, wherein said resin layer of the resin coating layer is formed of polyimide or epoxy resin and is heated at a temperature of 150–240° C. for at least 30 minutes for the curing.

15. The method according to claim 9, wherein said heating is performed in a convection oven, furnace or IR (infrared ray) reflow device maintaining a temperature higher than 190° C.

16. The method according to claim 13, further comprising after forming the chip bump:

applying a flux to the chip bump side of said chip and applying solder paste to form an additional chip bump on the resin coating layer at a position including said chip bump; and fusing the solder paste and cooling the fused solder paste thus enlarging the size of said chip bump.

17. The method according to claim 13, further comprising after forming the chip bump:

applying a flux to the chip bump side of said chip and applying a solder paste to said chip bump; and fusing the solder paste to the chip bump and cooling the fused solder paste and chip bump thus enlarging the size of said chip bump.

18. The method according to claim 17, wherein said flux is a rosin base flux.

19. The method according to claim 16, wherein said heating is performed in a convection oven, furnace or IR (infrared ray) reflow device maintaining a temperature higher than 190° C.

20. The method according to claim 16 wherein said flux is a rosin base flux.

* * * * *